United States Patent
Justice et al.

(10) Patent No.: US 9,904,320 B2
(45) Date of Patent: Feb. 27, 2018

(54) BATTERY COMPARTMENTS FOR WEARABLE ELECTRONIC DEVICE

(71) Applicant: Microsoft Technology Licensing, LLC, Redmond, WA (US)

(72) Inventors: Gregory Kim Justice, Redmond, WA (US); Robert L. Battey, Vancouver, WA (US); Adam Hewko, Kirkland, WA (US); Jonathan Hogander, Lake Oswego, OR (US); Benjamin Sherrett-Temple, Hubbard, OR (US); Scott F. Williams, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 315 days.

(21) Appl. No.: 14/292,472

(22) Filed: May 30, 2014

(65) Prior Publication Data
US 2015/0346766 A1    Dec. 3, 2015

(51) Int. Cl.
*G06F 1/16* (2006.01)
*H01M 2/10* (2006.01)
*H05K 7/06* (2006.01)
*G06F 1/18* (2006.01)
*H01M 10/42* (2006.01)
(Continued)

(52) U.S. Cl.
CPC ............. *G06F 1/163* (2013.01); *G04C 10/00* (2013.01); *G04G 17/02* (2013.01); *G06F 1/1635* (2013.01); *G06F 1/188* (2013.01); *H01M 2/1066* (2013.01); *H01M 10/425* (2013.01); *H05K 7/06* (2013.01); *H01M 2220/30* (2013.01); *Y10T 29/49004* (2015.01)

(58) Field of Classification Search
CPC ...... H05K 5/0086; H05K 5/062; H05K 5/063; H05K 5/0239; G06F 1/1635
USPC .................. 174/50.5–50.52, 50.59, 559–564
See application file for complete search history.

(56) References Cited

U.S. PATENT DOCUMENTS

| | | | |
|---|---|---|---|
| 5,872,744 | A | 2/1999 | Taylor |
| 6,035,035 | A | 3/2000 | Firooz |

(Continued)

FOREIGN PATENT DOCUMENTS

| | | |
|---|---|---|
| CN | 203367386 U | 12/2013 |
| WO | 2008112678 A2 | 9/2008 |
| WO | 2012061440 A2 | 5/2012 |

OTHER PUBLICATIONS

ISA European Patent Office, International Search Report and Written Opinion Issued in Application No. PCT/US2015/032770, dated Oct. 27, 2015, WIPO, 10 pages.

(Continued)

*Primary Examiner* — Hoa C Nguyen
*Assistant Examiner* — Christopher L Augustin
(74) *Attorney, Agent, or Firm* — Alleman Hall Creasman & Tuttle LLP (57) ABSTRACT

A battery box for a wearable computing device is disclosed. The battery box is comprised of a cover, battery, a structural housing sized to hold the battery, and a polymer rim. The battery box is enveloped in a thermoplastic elastomer molecularly bonded to the polymer rim. The polymer rim, thermoplastic elastomer, and cover of the battery box cooperatively resist fluid ingress into the battery box.

11 Claims, 8 Drawing Sheets

(51) Int. Cl.
*G04C 10/00* (2006.01)
*G04G 17/02* (2006.01)

(56) References Cited

U.S. PATENT DOCUMENTS

| | | | | |
|---|---|---|---|---|
| 6,285,159 | B1* | 9/2001 | Ki | G06F 1/1613 320/112 |
| 6,459,890 | B1 | 10/2002 | Kim | |
| 9,735,400 | B2* | 8/2017 | Watanabe | H01M 2/04 |
| 2001/0043513 | A1 | 11/2001 | Grupp | |
| 2005/0189906 | A1 | 9/2005 | Sun | |
| 2006/0226804 | A1* | 10/2006 | Lu | H01M 2/1066 320/107 |
| 2009/0201767 | A1 | 8/2009 | Caldwell | |
| 2010/0219943 | A1* | 9/2010 | Vanska | G06F 1/163 340/407.1 |
| 2011/0098583 | A1 | 4/2011 | Pandia et al. | |
| 2011/0160641 | A1 | 6/2011 | Ueda | |
| 2013/0106603 | A1* | 5/2013 | Weast | G06F 1/163 340/539.11 |
| 2013/0120459 | A1* | 5/2013 | Dickinson | G06F 1/163 345/650 |
| 2013/0146323 | A1* | 6/2013 | Yamaguchi | H05K 5/061 174/50 |
| 2014/0071600 | A1* | 3/2014 | Su | H04M 1/0202 361/679.01 |

OTHER PUBLICATIONS

Fingas, Jon, "TomTom's new GPS watches track your heart rate without a chest strap (update: US pricing)", http://www.engadget.com/2014/04/03/tomtom-cardio-gps-watches/, Apr. 3, 2014, 10 pages.
Goode, Lauren, "Samsung's New Gear Fit Needs to Work on the "Fit" Part", http://recode.net/2014/04/08/samsungs-new-gear-fit-needs-to-work-on-the-fit-part/, Apr. 8, 2014, 10 pages.
"Samsung Gear Fit, Gear 2 and Gear 2 Neo go on sale worldwide", NDTV Gadgets, http://gadgets.ndtv.com/others/news/samsung-gear-fit-gear-2-and-gear-2-neo-go-on-sale-worldwide-507220, Apr. 11, 2014, 3 pages.
Poeter, Damon, "Meet Simband, Samsung's Next-Gen Health Tracker", http://www.pcmag.com/article2/0,2817,2458663,00.asp, May 28, 2014, 5 pages.
IPEA European Patent Office, Second Written Opinion issued in PCT Application No. PCT/US2015/032770, dated May 20, 2016, WIPO, 5 pages.
IPEA European Patent Office, International Preliminary Report on Patentability Issued in PCT Application No. PCT/US2015/032770, dated Sep. 28, 2016, WIPO, 7 pages.

* cited by examiner

BATTERY COMPARTMENTS FOR WEARABLE ELECTRONIC DEVICE

DETAILED DESCRIPTION

Aspects of this disclosure will now be described by example and with reference to the drawing figures listed above. Components and other elements that may be substantially the same in one or more figures are identified coordinately and described with minimal repetition. It will be noted, however, that elements identified coordinately may also differ to some degree.

Figure 1A:
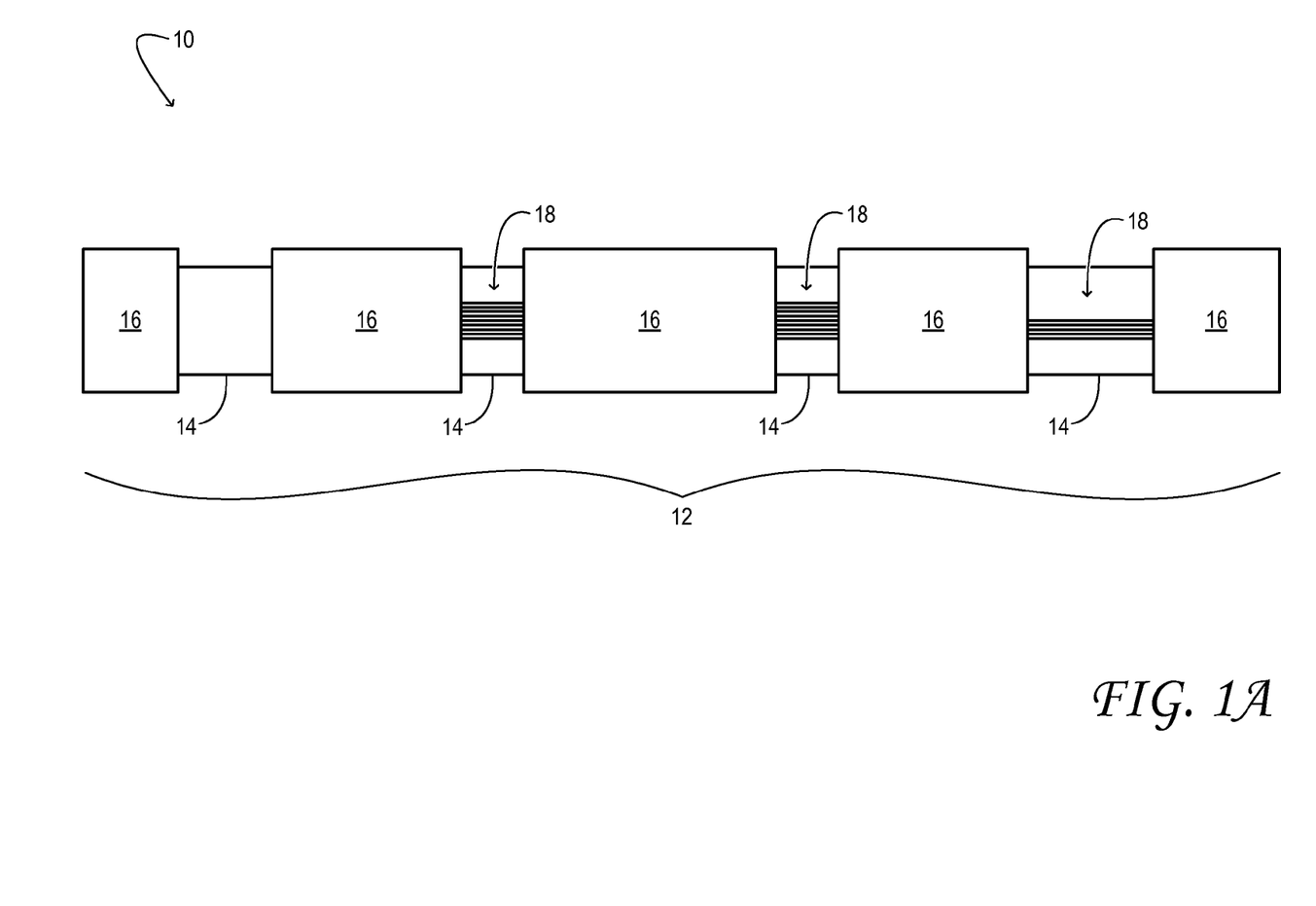
FIG. 1A schematically shows aspects of an example wearable electronic device.
Figure 1B:
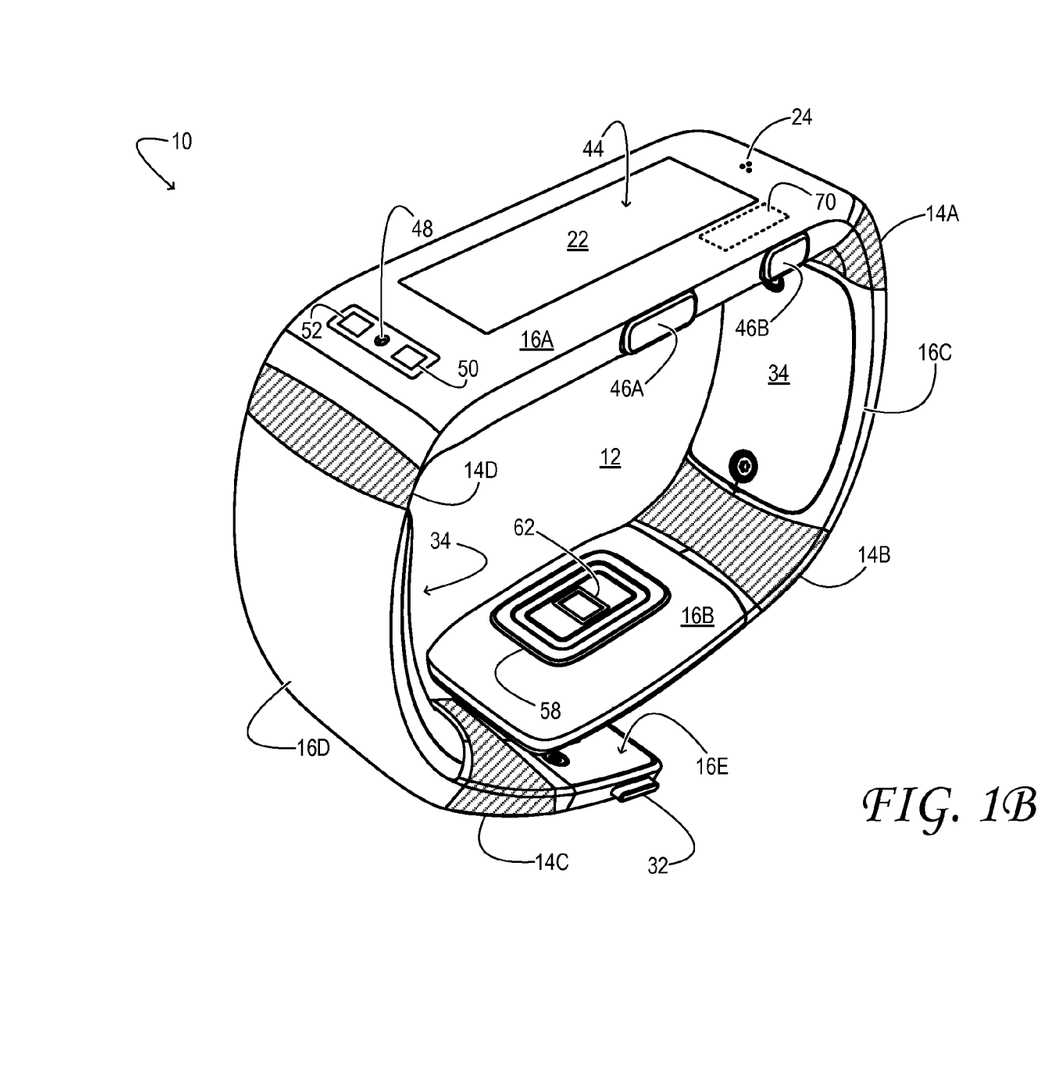
FIGS. 1B and 1C show additional aspects of an example wearable electronic device.
Figure 1C:
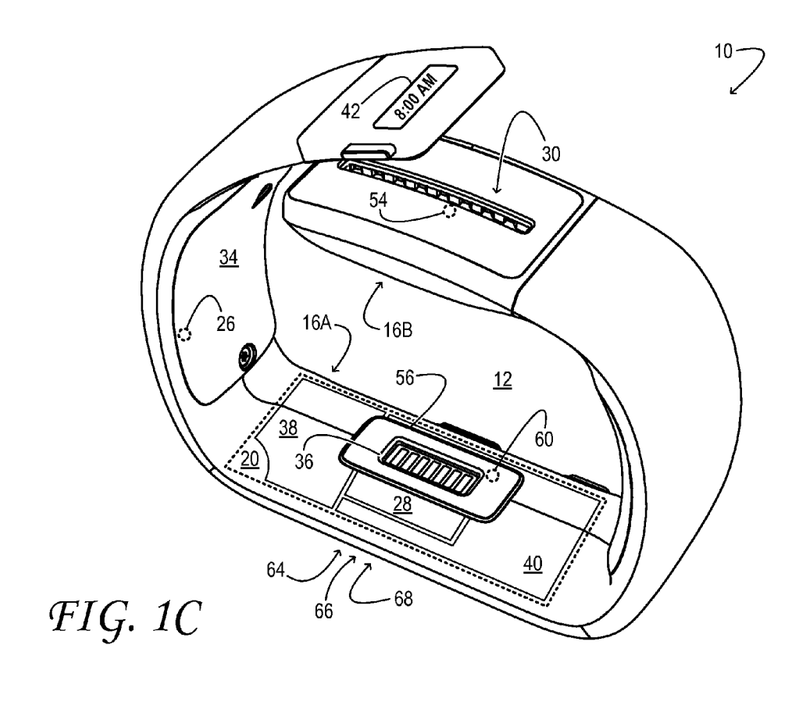

FIGS. 1A-C show aspects of a wearable computing device or wearable electronic device 10 in one, non-limiting configuration. The illustrated device takes the form of a composite band 12, which may be worn around a wrist. Composite band 12 includes flexible segments 14 and rigid segments 16. The terms 'flexible' and 'rigid' are to be understood in relation to each other, not necessarily in an absolute sense. Moreover, a flexible segment may be relatively flexible with respect to one bending mode and/or stretching mode, while being relatively inflexible with respect to other bending modes, and to twisting modes. A flexible segment may be elastomeric in some examples. In these and other examples, a flexible segment may include a hinge and may rely on the hinge for flexibility, at least in part.

The illustrated configuration includes four flexible segments 14 linking five rigid segments 16. Other configurations may include more or fewer flexible segments, and more or fewer rigid segments. In some implementations, a flexible segment is coupled between pairs of adjacent rigid segments.

Various functional components, sensors, energy-storage cells, etc., of wearable electronic device 10 may be distributed among multiple rigid segments 16. Accordingly, as shown schematically in FIG. 1A, one or more of the intervening flexible segments 14 may include a course of electrical conductors 18 running between adjacent rigid segments, inside or through the intervening flexible segment. The course of electrical conductors may include conductors that distribute power, receive or transmit a communication signal, or carry a control or sensory signal from one functional component of the device to another. In some implementations, a course of electrical conductors may be provided in the form of a flexible printed-circuit assembly (FPCA, vide infra), which also may physically support various electronic and/or logic components.

In one implementation, a closure mechanism enables *facile* attachment and separation of the ends of composite band 12, so that the band can be closed into a loop and worn on the wrist. In other implementations, the device may be fabricated as a continuous loop resilient enough to be pulled over the hand and still conform to the wrist. Alternatively, the device may have an open bracelet form factor in which ends of the band are not fastened to one another. In still other implementations, wearable electronic devices of a more elongate band shape may be worn around the user's bicep, waist, chest, ankle, leg, head, or other body part. Accordingly, the wearable electronic devices here contemplated include eye glasses, a head band, an arm-band, an ankle band, a chest strap, or even an implantable device to be implanted in tissue.

As shown in FIGS. 1B and 1C, wearable electronic device 10 includes various functional components: a compute system 20, display 22, loudspeaker 24, haptic motor 26, communication suite 28, and various sensors. In the illustrated implementation, the functional components are integrated into rigid segments 16—viz., display-carrier module 16A, pillow 16B, battery compartments 16C and 16D, and buckle 16E. This tactic protects the functional components from physical stress, from excess heat and humidity, and from exposure to water and substances found on the skin, such as sweat, lotions, salves, and the like.

In the illustrated conformation of wearable electronic device 10, one end of composite band 12 overlaps the other end. A buckle 16E is arranged at the overlapping end of the composite band, and a receiving slot 30 is arranged at the overlapped end. As shown in greater detail herein, the receiving slot has a concealed rack feature, and the buckle includes a set of pawls to engage the rack feature. The buckle snaps into the receiving slot and slides forward or backward for proper adjustment. When the buckle is pushed into the slot at an appropriate angle, the pawls ratchet into tighter fitting set points. When release buttons 32 are squeezed simultaneously, the pawls release from the rack feature, allowing the composite band to be loosened or removed.

The functional components of wearable electronic device 10 draw power from one or more energy-storage cells 34. A battery—e.g., a lithium ion battery—is one type of energy-storage cell suitable for this purpose. Examples of alternative energy-storage cells include super- and ultra-capacitors. A typical energy storage cell is a rigid structure of a size that scales with storage capacity. To provide adequate storage capacity with minimal rigid bulk, a plurality of discrete separated energy storage cells may be used. These may be arranged in battery compartments 16C and 16D, or in any of the rigid segments 16 of composite band 12. Electrical connections between the energy storage cells and the functional components are routed through flexible segments 14. In some implementations, the energy storage cells have a curved shape to fit comfortably around the wearer's wrist, or other body part.

In general, energy-storage cells 34 may be replaceable and/or rechargeable. In some examples, recharge power may be provided through a universal serial bus (USB) port 36, which includes a magnetic latch to releasably secure a complementary USB connector. In other examples, the energy storage cells may be recharged by wireless inductive or ambient-light charging. In still other examples, the wearable electronic device may include electro-mechanical componentry to recharge the energy storage cells from the user's adventitious or purposeful body motion. More specifically, the energy-storage cells may be charged by an electromechanical generator integrated into wearable electronic device 10. The generator may be actuated by a mechanical armature that moves when the user is moving.

In wearable electronic device 10, compute system 20 is housed in display-carrier module 16A and situated below display 22. The compute system is operatively coupled to display 22, loudspeaker 24, communication suite 28, and to the various sensors. The compute system/device includes a data-storage machine 38 to hold data and instructions, and a logic machine 40 to execute the instructions.

Display 22 may be any suitable type of display, such as a thin, low-power light emitting diode (LED) array or a liquid-crystal display (LCD) array. Quantum-dot display technology may also be used. Suitable LED arrays include organic LED (OLED) or active matrix OLED arrays, among others. An LCD array may be actively backlit. However, some types of LCD arrays—e.g., a liquid crystal on silicon, LCOS array—may be front-lit via ambient light. Although the drawings show a substantially flat display surface, this aspect is by no means necessary, for curved display surfaces may also be used. In some use scenarios, wearable electronic device 10 may be worn with display 22 on the front of the wearer's wrist, like a conventional wristwatch. However, positioning the display on the back of the wrist may provide greater privacy and ease of touch input. To accommodate use scenarios in which the device is worn with the display on the back of the wrist, an auxiliary display module 42 may be included on the rigid segment opposite display-carrier module 16A. The auxiliary display module may show the time of day, for example.

Communication suite 28 may include any appropriate wired or wireless communications componentry. In FIGS. 1B and 1C, the communications suite includes USB port 36, which may be used for exchanging data between wearable electronic device 10 and other computer systems, as well as providing recharge power. The communication suite may further include two-way Bluetooth, Wi-Fi, cellular, near-field communication, and/or other radios. In some implementations, the communication suite may include an additional transceiver for optical, line-of-sight (e.g., infrared) communication.

In wearable electronic device 10, touch-screen sensor 44 is coupled to display 22 and configured to receive touch input from the user. Accordingly, the display may be a touch-sensor display in some implementations. In general, the touch sensor may be resistive, capacitive, or optically based. Push-button sensors (e.g., microswitches) may be used to detect the state of push buttons 46A and 46B, which may include rockers. Input from the push-button sensors may be used to enact a home-key or on-off feature, control audio volume, microphone, etc.

FIGS. 1B and 1C show various other sensors of wearable electronic device 10. Such sensors include microphone 48, visible-light sensor 50, ultraviolet sensor 52, and ambient-temperature sensor 54. The microphone provides input to compute system 20 that may be used to measure the ambient sound level or receive voice commands from the user. Input from the visible-light sensor, ultraviolet sensor, and ambient-temperature sensor may be used to assess aspects of the user's environment. In particular, the visible-light sensor can be used to sense the overall lighting level, while the ultraviolet sensor senses whether the device is situated indoors or outdoors. In some scenarios, output from the visible light sensor may be used to automatically adjust the brightness level of display 22, or to improve the accuracy of the ultraviolet sensor. In the illustrated configuration, the ambient-temperature sensor takes the form a thermistor, which is arranged behind a metallic enclosure of pillow 16B, next to receiving slot 30. This location provides a direct conductive path to the ambient air, while protecting the sensor from moisture and other environmental effects.

FIGS. 1B and 1C show a pair of contact sensors—charging contact sensor 56 arranged on display-carrier 16A, and pillow contact sensor 58 arranged on pillow 16B. Each contact sensor contacts the wearer's skin when wearable electronic device 10 is worn. The contact sensors may include independent or cooperating sensor elements, to provide a plurality of sensory functions. For example, the contact sensors may provide an electrical resistance and/or capacitance sensory function responsive to the electrical resistance and/or capacitance of the wearer's skin. To this end, the two contact sensors may be configured as a galvanic skin-response sensor, for example. Compute system 20 may use the sensory input from the contact sensors to assess whether, or how tightly, the device is being worn, for example. In the illustrated configuration, the separation between the two contact sensors provides a relatively long electrical path length, for more accurate measurement of skin resistance. In some examples, a contact sensor may also provide measurement of the wearer's skin temperature. In the illustrated configuration, a skin temperature sensor 60 in the form a thermistor is integrated into charging contact sensor 56, which provides direct thermal conductive path to the skin. Output from ambient-temperature sensor 54 and skin temperature sensor 60 may be applied differentially to estimate of the heat flux from the wearer's body. This metric can be used to improve the accuracy of pedometer-based calorie counting, for example. In addition to the contact-based skin sensors described above, various types of non-contact skin sensors may also be included.

Arranged inside pillow contact sensor 58 in the illustrated configuration is an optical pulse-rate sensor 62. The optical pulse-rate sensor may include a narrow-band (e.g., green) LED emitter and matched photodiode to detect pulsating blood flow through the capillaries of the skin, and thereby provide a measurement of the wearer's pulse rate. In some implementations, the optical pulse-rate sensor may also be configured to sense the wearer's blood pressure. In the illustrated configuration, optical pulse-rate sensor 62 and display 22 are arranged on opposite sides of the device as worn. The pulse-rate sensor alternatively could be positioned directly behind the display for ease of engineering. In some implementations, however, a better reading is obtained when the sensor is separated from the display.

Wearable electronic device 10 may also include motion sensing componentry, such as an accelerometer 64, gyroscope 66, and magnetometer 68. The accelerometer and gyroscope may furnish inertial data along three orthogonal axes as well as rotational data about the three axes, for a combined six degrees of freedom. This sensory data can be used to provide a pedometer/calorie-counting function, for example. Data from the accelerometer and gyroscope may be combined with geomagnetic data from the magnetometer to further define the inertial and rotational data in terms of geographic orientation.

Wearable electronic device 10 may also include a global positioning system (GPS) receiver 70 for determining the wearer's geographic location and/or velocity. In some configurations, the antenna of the GPS receiver may be relatively flexible and extend into flexible segment 14A. In the configuration of FIGS. 1B and 1C, the GPS receiver is far removed from optical pulse-rate sensor 62 to reduce interference from the optical pulse-rate sensor. More generally, various functional components of the wearable electronic device—display 22, compute system 20, GPS receiver 70, USB port 36, microphone 48, visible-light sensor 50, ultraviolet sensor 52, and skin temperature sensor 60—may be located in the same rigid segment for ease of engineering, but the optical pulse-rate sensor may be located elsewhere to reduce interference on the other functional components.

Figure 2A:
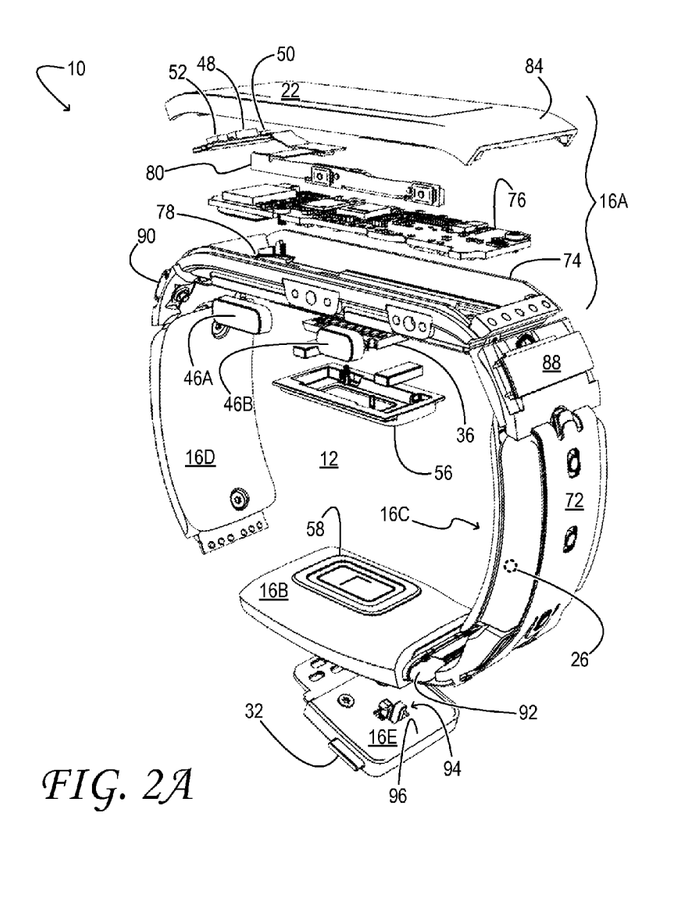
FIGS. 2A and 2B are exploded views of an example wearable electronic device.
Figure 2B:
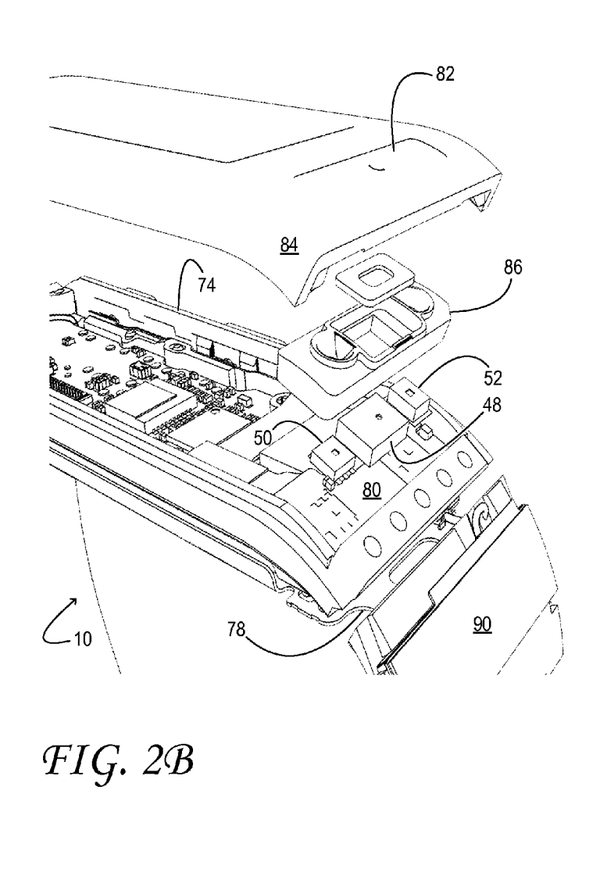

FIGS. 2A and 2B show aspects of the internal structure of wearable electronic device 10 in one, non-limiting configuration. In particular, FIG. 2A shows semi-flexible armature 72 and display carrier 74. The semi-flexible armature is the backbone of composite band 12, which supports display-carrier 16A, pillow 16B, and battery compartments 16B and 16C. The semi-flexible armature may be a very thin band of steel, in one implementation. The display carrier may be a metal frame overmolded with plastic. It may be attached to the semi-flexible armature with mechanical fasteners such that display 22 is exterior semi-flexible armature 72. In one implementation, these fasteners are molded-in rivet features, but screws or other fasteners may be used instead. The display carrier provides suitable stiffness in display-carrier module 16A to protect display 22 from bending or twisting movements that could dislodge or break it. In the illustrated configuration, the display carrier also surrounds the main printed circuit assembly (PCA) 76, where compute system 20 is located, and provides mounting features for the main PCA.

In the configuration of FIG. 2A, push buttons 46A and 46B penetrate one side of display carrier 74. These push buttons are assembled directly into the display carrier and are sealed by o-rings. The push buttons act against microswitches mounted to a sensor FPCA 80.

Display-carrier 16A also encloses sensor FPCA 80. At one end of rigid segment 16A, and located on the sensor FPCA, are visible-light sensor 50, ultraviolet sensor 52, and microphone 48. A polymethylmethacrylate window 82 is insert molded into a glass insert-molded (GIM) bezel 84 of display-carrier 16A, over these three sensors. The window has a hole for the microphone and is printed with IR transparent ink on the inside covering except over the ultraviolet sensor. A water repellent gasket 86 is positioned over the microphone, and a thermoplastic elastomer (TPE) boot surrounds all three components. The purpose of the boot is to acoustically seal the microphone and make the area more cosmetically appealing when viewed from the outside.

As noted above, display carrier 74 may be overmolded with plastic. This overmolding does several things. First, the overmolding provides a surface that the device TPE overmolding will bond to chemically. Second, it creates a shut-off surface, so that when the device is overmolded with TPE, the TPE will not ingress into the display carrier compartment. Finally, the PC overmolding creates a glue land for attaching the upper portion of display-carrier 16A.

The charging contacts of USB port 36 are overmolded into a plastic substrate and reflow soldered to main FPCA 78 which runs from pillow 16B all the way to battery compartment 16D. In the illustrated configuration, the main FPCA is located beneath semi-flexible armature 72 and assembled onto integral features of the display carrier. The main FPCA may be attached to the inside surface of semi-flexible armature 72. In the illustrated configuration, charging contact sensor 56 is frame-shaped and surrounds the charging contacts. It is attached to the semi-flexible armature directly under display carrier 74—e.g., with rivet features. Skin temperature sensor 60 (not shown in FIG. 2A or 2B) is attached to the main FPCA under the charging contact-sensor frame, and thermal conduction is maintained from the frame to the sensor with thermally conductive putty.

FIGS. 2A and 2B also show a Bluetooth antenna 88 and a GPS antenna 90, which are coupled to their respective radios via shielded connections. Each antenna is attached to semi-flexible armature 72 on either side of display carrier 74. The semi-flexible armature may serve as a ground plane for the antennas, in some implementations. Formed as FPCAs and attached to plastic antenna substrates with adhesive, the Bluetooth and GPS antennas extend into flexible segments 14A and 14D, respectively. The plastic antenna substrates maintain about a 2-millimeter spacing between the semi-flexible armature and the antennae, in some examples. The antenna substrates may be attached to semi-flexible armature 72 with heat staked posts. TPE filler parts are attached around the antenna substrates. These TPE filler parts may prevent TPE defects like 'sink' when the device is overmolded with TPE.

FIG. 2A also shows battery compartments (battery boxes) 16C and 16D, attached to the inside surface of semi-flexible armature 72, such that main FPCA 78 is sandwiched between the battery compartments and the semi-flexible armature. Further, battery compartments 16C and 16D are attached to semi-flexible armature 72 such that display carrier 74, display 22 and compute system 20 are located between the battery compartments. The battery compartments have an overmolded rim that serves the same functions as the plastic overmolding previously described for display carrier 74. The battery compartments may be attached with integral rivet features molded-in. In the illustrated configuration, battery compartment 16C also encloses haptic motor 26.

Shown also in FIG. 2A, a bulkhead 92 is arranged at and welded to one end of semi-flexible armature 72. This feature is shown in greater detail in the exploded view of FIG. 3. The bulkhead provides an attachment point for pillow contact sensor 58. The other end of the semi-flexible armature extends through battery compartment 16D, where flexible strap 14C is attached. The strap is omitted from FIG. 2 for clarity, but is shown in FIGS. 1B and 1C. In one example, the strap is attached with rivets formed integrally in the battery compartment. In another embodiment, a plastic end part of the strap is molded-in as part of the battery compartment overmolding process.

In the configuration of FIG. 2A, buckle 16E is attached to the other end of strap 14C. The buckle includes two opposing, spring-loaded pawls 94 constrained to move laterally in a sheet-metal spring box 96. The pawls and spring box are concealed by the buckle housing and cover, which also have attachment features for the strap. The two release buttons 32 protrude from opposite sides of the buckle housing. When these buttons are depressed simultaneously, they release the pawls from the track of receiving slot 30 (as shown in FIG. 1C).

Figure 3:
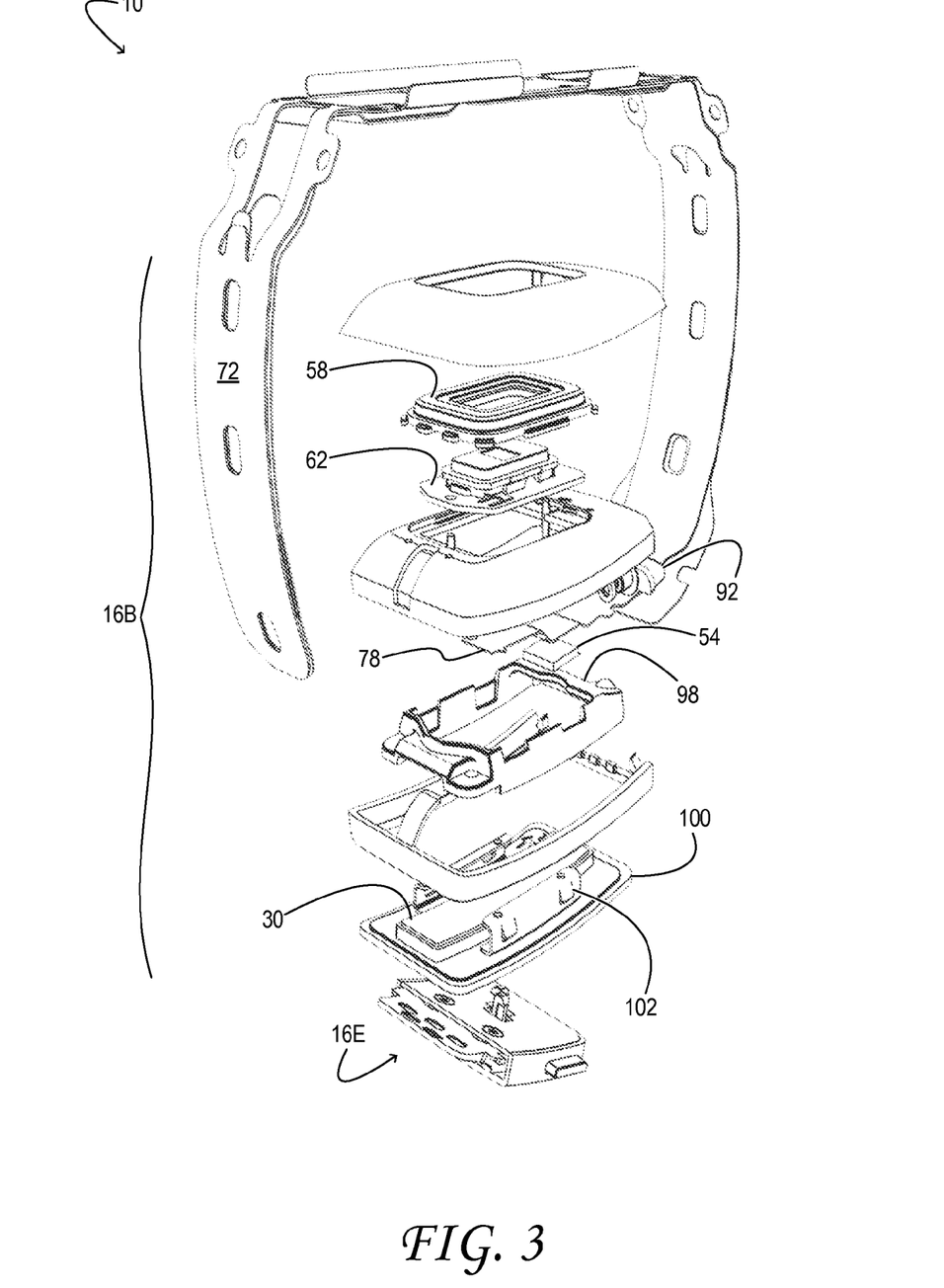
FIG. 3 is an exploded view of a portion of an example wearable electronic device.

Turning now to FIG. 3, pillow 16B includes pillow contact sensor 58, which surrounds optical pulse-rate sensor 62. The pillow also includes TPE and plastic overmoldings, an internal structural pillow case 98, and a sheet-metal or MIMS inner band 100. The pillow assembly is attached to bulkhead 92 with adhesives for sealing out water and by two screws that clamp the pillow case and the plastic overmolding securely to the bulkhead. The inner band includes receiving slot 30 and its concealed rack feature. In the illustrated configuration, the inner band is attached to the pillow via adhesives for water sealing and spring steel snaps 102, which are welded to the inside of the inner band on either side of the concealed rack. Main FPCA 78 extends through the bulkhead and into the pillow assembly, to pillow contact sensor 58. Ambient-temperature sensor 54 is attached to this FPCA and surrounded by a small plastic frame. The frame contains thermal putty to help maintain a conduction path through the inner band to the sensor. On the opposite side of the FPCA from the sensor a foam spring may be used to push the sensor, its frame, and thermal putty against the inside surface of the inner band.

Compute system 20, via the sensory functions described herein, may be configured to acquire various forms of information about the wearer of wearable electronic device 10. Such information must be acquired and used with utmost respect for the wearer's privacy. Accordingly, the sensory functions may be enacted subject to opt-in participation of the wearer. In implementations where personal data is collected on the device and transmitted to a remote system for processing, that data may be anonymized. In other examples, personal data may be confined to the wearable electronic device, and only non-personal, summary data transmitted to the remote system.

Figure 4:
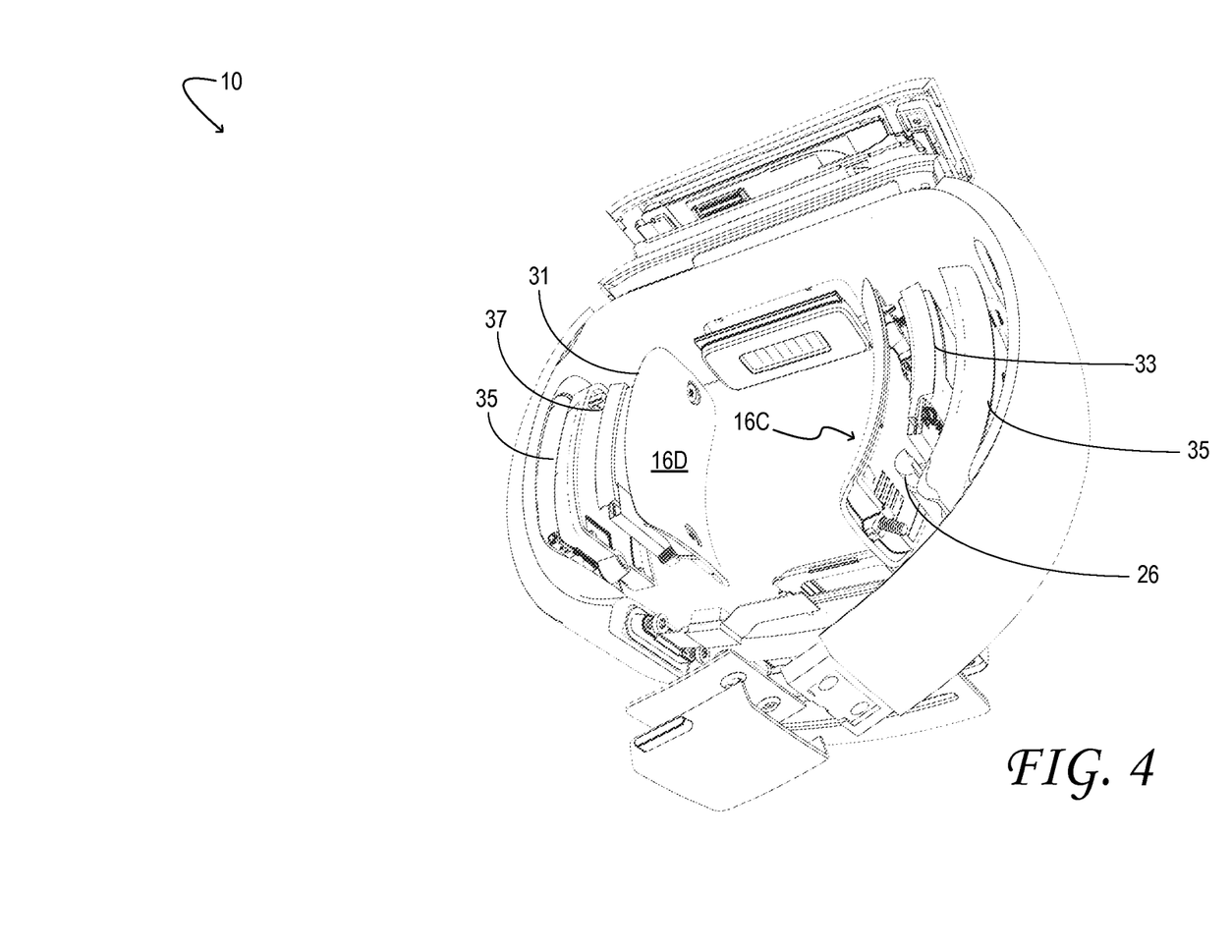
FIG. 4 is an exploded view of a portion of an example wearable electronic device.

FIG. 4 illustrates an exploded view of wearable electronic device 10. The power requirements of the wearable computing device may exceed the capacity of a single battery. Accordingly, a configuration with a first battery compartment 16C and a second battery compartment 16D may be implemented. Battery compartments 16C and 16D may include a cover 31 and a battery housing 35 that cooperate to cover and protect a battery 33/37. Optionally, each battery compartment may be configured to additionally house a haptic motor 26 as shown for battery compartment 16C.

Figure 5A:
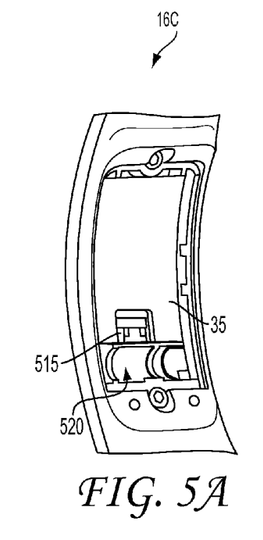
FIGS. 5A, 5B, and 5C show aspects of an example open battery compartment.
Figure 5B:
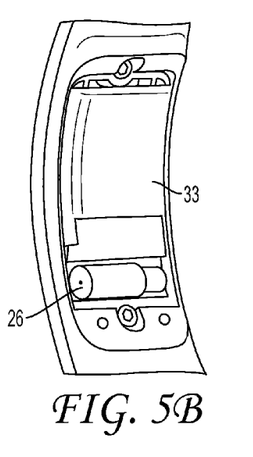
Figure 5C:
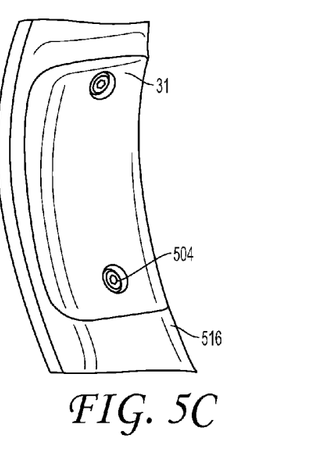

FIGS. 5A, 5B, and 5C show an example battery compartment 16C. Battery compartment 16C may include a cover 31 secured by one or more fasteners 504. Battery compartment 16C may house battery 33 and haptic motor 26. Battery compartment 16C may be manufactured in an open battery box configuration. The open battery box configuration of battery compartment 16C allows for access to battery 33 and haptic motor 26 (if present) upon removal of cover 31. Battery compartment 16C may include a battery connector 515. Battery connector 515 may be connected to battery 33 to facilitate the transfer of electrical power between battery 33 and the other components of the wearable computing device. Battery compartment 16C may also include one or more mounts 520 to support haptic motor 26.

Battery 33 may change in size over its lifespan. Accordingly, battery compartment 16C may be sized to accommodate the lifetime expansion of battery 33. Thus, battery compartment 16C may be oversized for the respective battery 33 early in the lifetime of the battery, thus providing space for expansion of the battery as it ages.

Battery compartment 16C may be enveloped by a thermoplastic elastomer coating 516. Thermoplastic elastomer coating 516 may function to electrically insulate and cushion the wearer from battery compartment 16C. Further, thermoplastic elastomer coating 516 may be applied to other components of the wearable electronic device to obtain a smooth continuous surface throughout. Thermoplastic elastomer coating 516 is applied in such a manner as to maintain access to battery compartment 16C and allow the attachment of cover 31.

Figure 5D:
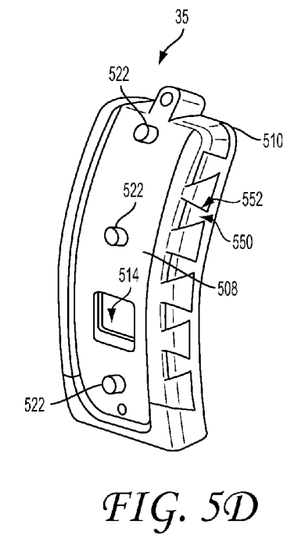
FIG. 5D shows a rear view of an example battery housing.

FIG. 5D shows a rear view of battery housing 35. The external surface of battery housing 35 may include one or more rivets 522 on structural housing 508. Both main FPCA 78 (not shown) and semi-flexible armature 72 (not shown) may be secured to structural housing 508 with one or more rivets 522. Rivets 522 may be configured to align with rivet holes 530 of main FPCA 78 and rivet holes 540 of semi-flexible armature 72, as shown in FIG. 5E.

Figure 5E:
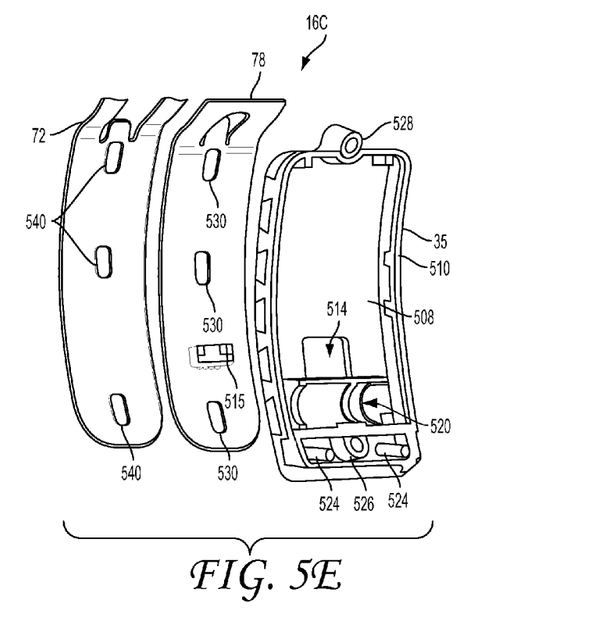
FIG. 5E schematically shows an exploded view of an example open battery compartment.

FIG. 5E shows an exploded view of battery compartment 16C including a battery housing 35. FIG. 5E also shows main FPCA 78 and semi-flexible armature 72. Battery housing 35 may be comprised of a structural housing 508 sized to house a battery. Structural housing 508 may also include a mouth that defines the opening for the battery and an access port 514 located within the base of structural housing 508. Other components of structural housing 508 include internal rivets 524 located at a lower portion of structural housing 508. Upper screw boss 528 and lower screw boss 526 may be located to align with fastener ports of the cover and receive fasteners to secure the cover to battery housing 35. Structural housing 508 may include an access port 514 providing connection access to the battery within the battery box.

Structural housing 508 may be comprised in part or completely of nickel or any other suitable metal. Structural housing 508 may be formed by molding, die casting, or any other suitable method(s) of manufacture. Structural housing 508 and battery compartment 16C may be elongate as shown. Furthermore, battery compartment 16C may be constructed with a zero or non-zero radius of curvature for compatibility with the form factor of the wearable computing device. In other configurations, the structural housing may be differently shaped in accordance with comfort and/or aesthetic considerations.

Figure 5F:
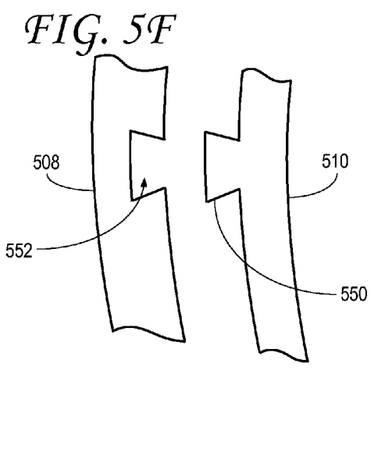
FIG. 5F schematically shows an example dovetail and dovetail socket detail of an example open battery box assembly.

A polymer rim 510 may be overlaid onto the mouth of structural housing 508. Polymer rim 510 may be connected to the mouth of structural housing 508 through the use of a plurality of interlocking dovetails 550 and dovetail sockets 552 as shown in FIGS. 5D and 5F. The plurality of dovetail sockets 552 are defined by the mouth of structural housing 508. Each dovetail socket 552 is sized to interlock with a complimentary dovetail 550 of polymer rim 510. Together, the dovetail socket 552 and the dovetail 550 cooperatively form the sides of the battery housing.

Polymer rim 510 may be formed from a plastic, rubber, or any other polymer compound. The polymer compound of polymer rim 510 provides the advantage of molecularly bonding with the thermoplastic elastomer coating. The molecular bonds formed between the thermoplastic elastomer coating and polymer rim 510 function to secure the thermoplastic elastomer coating to the exterior of the battery compartment. Furthermore, the molecular bonding prevents delamination of the thermoplastic elastomer coating from the battery compartment over the lifespan of the wearable computing device.

Turning back to FIG. 5C, polymer rim 510, battery compartment cover 31, and thermoplastic elastomer coating 516 may cooperatively resist fluid ingress into battery compartment 16C. Polymer rim 510 may provide a sealing surface for battery compartment cover 31 when secured.

As shown in FIG. 5E, main FPCA 78 may be secured to an external surface of structural housing 508 between structural housing 508 and thermoplastic elastomer coating 516. As discussed above, main FPCA 78 is a flexible circuit array and may include battery connector 515. When main FPCA 78 is secured to the external surface of structural housing 508, battery connector 515 extends through access port 514 and electrically connects with the battery within. Battery connector 515 allows main FPCA 78 to conduct electrical power between the battery and the various components of the wearable computing device. Battery connector 515 may be a SMT connector, welded leads, or any other suitable electrical connector.

Main FPCA 78 may be located between an external surface of structural housing 508 and semi-flexible armature 72. As discussed above, semi-flexible armature 72 may include a steel band and form a continuous structural element to which one or more battery compartments, the compute system, and other components of the wearable computing device may be attached. In addition to providing attachment points for the various components of the wearable computing device, semi-flexible armature 72 provides additional structural stability to main FPCA 78 and structural housing 508. Furthermore, semi-flexible armature 72 may protect main FPCA 78 from heat and chemical damage during the application of the thermoplastic elastomer coating.

Figure 6:
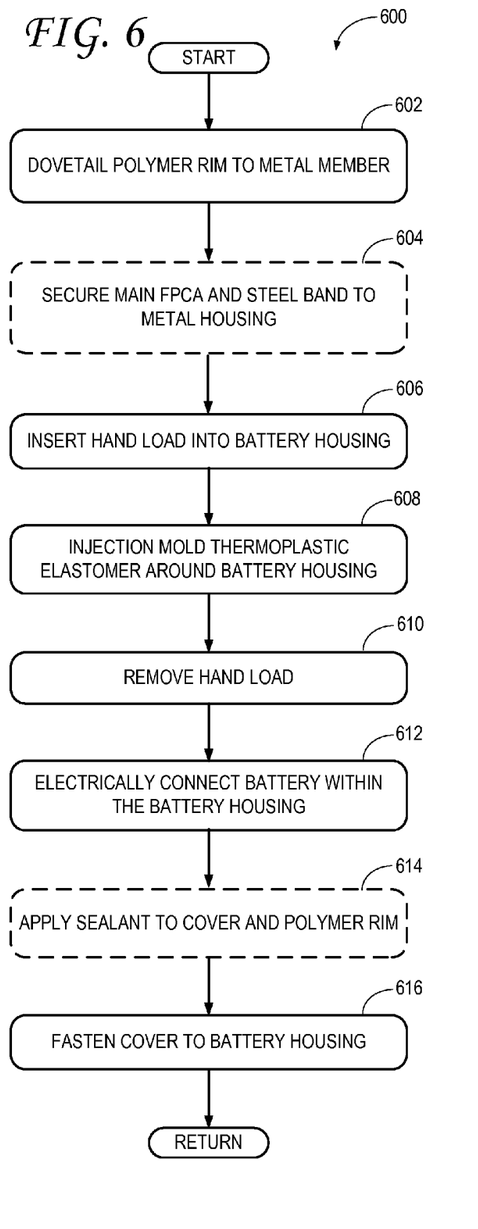
FIG. 6 illustrates a method of manufacturing a wearable electronic device including an open battery compartment.

FIG. 6 illustrates a method 600 of manufacturing a battery compartment for a wearable computing device. Method 600 includes steps to assemble the battery compartment, secure the battery compartment to the main FPCA and semi-flexible armature, and steps to prevent ingress of the thermoplastic elastomer coating during injection molding.

At 602, method 600 includes dovetailing a polymer rim to a metal member to form a battery housing. The polymer rim is secured to the metal member through a plurality of interlocked dovetails on the polymer rim and a plurality of dovetail sockets within the mouth of the metal member. As on example, the polymer rim may be molded in place into and around the dovetail sockets of the metal member.

At 604, method 600 optionally includes securing the main FPCA and semi-flexible armature to the metal member of the battery housing. As discussed above, the main FPCA and/or the semi-flexible armature may be sandwiched between the battery housing and a later-applied thermoplastic elastomer. One or more rivets on the external surface of the metal member of the battery housing may facilitate securement of the main FPCA and/or semi-flexible armature to the battery housing, or another attachment mechanism may be used.

At 606, method 600 includes inserting a dummy battery or hand load into the housing of the battery compartment. The hand load is sized to fit snugly within the entire interior of the battery housing. The hand load acts to block ingress of liquid thermoplastic elastomer during injection molding.

At 608, method 600 includes injection molding liquid thermoplastic elastomer around the housing of the battery compartment. The injection molding process may be performed at sufficient temperature and pressure to facilitate the formation of molecular bonds between the polymer rim and the thermoplastic elastomer. The temperature and pressure of the thermoplastic elastomer may be limited to prevent damage to the main FPCA or battery compartment by excessive heat, chemical processes, or excessive pressure. After the injection molding process is completed, the back and sides of the battery housing will be enveloped in solid thermoplastic elastomer and method 600 may proceed to 610.

At 610, method 600 includes removing the hand load from the battery housing. The area around the opening of the battery housing may be cosmetically machined prior to advancing to step 612.

At 612, method 600 includes electrically connecting the battery within the battery housing. As discussed above, the battery may be electrically connected to the main FPCA via SMT connector, battery leads, or any other suitable connection.

At 614, method 600 may optionally include applying a sealant to the sealing surfaces of the polymer rim and/or battery compartment cover prior to fastening the battery compartment cover to the battery housing at 616. The battery compartment cover may be secured with one or more fasteners.

It will be understood that the configurations and approaches described herein are exemplary in nature, and that these specific implementations or examples are not to be taken in a limiting sense, because numerous variations are feasible. The specific routines or methods described herein may represent one or more processing strategies. As such, various acts shown or described may be performed in the sequence shown or described, in other sequences, in parallel, or omitted.

The subject matter of this disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device, comprising:
   a battery; and
   a structural housing forming a bottom and a lower portion of a sidewall of a battery box sized to hold the battery and including:
      a mouth that defines an opening sized to receive the battery and a plurality of dovetail sockets, and
      an access port providing connection access to the battery;
   a polymer rim forming a plurality of dovetails, each dovetail configured to interlock with a complimentary dovetail socket of the mouth thereby mechanically connecting the polymer rim to the structural housing, the polymer rim forming an upper portion of the sidewall of the battery box such that the polymer rim increases a height of the sidewall beyond the structural housing;
   a thermoplastic elastomer molecularly bonded to an exterior side of the polymer rim to envelop an exterior of the battery box; and
   a cover forming a top of the battery box and connectable to the structural housing such that the cover interfaces with a face cooperatively formed from the polymer rim and the thermoplastic elastomer to resist fluid ingress into the battery box.

2. The computing device of claim 1, wherein the structural housing is comprised at least partially by metal.

3. The computing device of claim 1, wherein the structural housing is sized to accommodate lifetime expansion of the battery.

4. The computing device of claim 1, further comprising a haptic motor, wherein the structural housing includes one or more motor mounts configured to hold the haptic motor within the battery box.

5. The computing device of claim 1, further comprising a flexible printed circuit array between the structural housing and the thermoplastic elastomer.

6. The computing device of claim 5, further comprising a battery connector extending from the flexible printed circuit array to the battery through the access port of the structural housing.

7. The computing device of claim 1, further comprising a steel band between the structural housing and the thermoplastic elastomer.

8. The computing device of claim 7, further comprising a flexible printed circuit array between the structural housing and the steel band.

9. The computing device of claim 8, wherein the flexible printed circuit array and the steel band are secured to the structural housing by one or more rivets.

10. The computing device of claim 1, further comprising a plurality of fasteners, wherein the structural housing includes a plurality of bosses exterior the polymer rim, the cover includes a plurality of ports aligned with the plurality of bosses, and each of the plurality of fasteners extends through a corresponding port into a corresponding boss to seal the cover to the polymer rim.

11. The computing device of claim 1, wherein the battery box is elongate with a nonzero radius of curvature.

* * * * *